(12) United States Patent
Wang et al.

(10) Patent No.: US 8,557,678 B2
(45) Date of Patent: Oct. 15, 2013

(54) METHOD FOR MANUFACTURING SEMICONDUCTOR SUBSTRATE OF LARGE-POWER DEVICE

(75) Inventors: Pengfei Wang, Shanghai (CN); Xi Lin, Shanghai (CN); Wei Zhang, Shanghai (CN)

(73) Assignee: Fudan University, Shanghai (CN)

( * ) Notice: Subject to any disclaimer, the term of this patent is extended or adjusted under 35 U.S.C. 154(b) by 0 days.

(21) Appl. No.: 13/498,144

(22) PCT Filed: Nov. 18, 2011

(86) PCT No.: PCT/CN2011/001926
§ 371 (c)(1),
(2), (4) Date: Aug. 23, 2012

(87) PCT Pub. No.: WO2012/068777
PCT Pub. Date: May 31, 2012

(65) Prior Publication Data
US 2013/0065365 A1    Mar. 14, 2013

(30) Foreign Application Priority Data
Nov. 22, 2010   (CN) .......................... 2010 1 0552635

(51) Int. Cl.
*H01L 21/30*    (2006.01)
*H01L 21/46*    (2006.01)

(52) U.S. Cl.
USPC .................................. 438/455; 257/E21.088

(58) Field of Classification Search
USPC ..................... 438/455, 406, 138; 257/E21.08
See application file for complete search history.

(56) References Cited

U.S. PATENT DOCUMENTS

| 2012/0061727 A1* | 3/2012 | Lee et al. | 257/183 |
| 2013/0000715 A1* | 1/2013 | Moslehi et al. | 136/256 |
| 2013/0122663 A1* | 5/2013 | Lu | 438/138 |

* cited by examiner

*Primary Examiner* — William D Coleman
*Assistant Examiner* — Christine Enad
(74) *Attorney, Agent, or Firm* — Niro, Haller & Niro

(57) ABSTRACT

The invention belongs to the technical field of high-voltage, large-power devices and in particular relates to a method for manufacturing a semiconductor substrate of a large-power device. According to the method, the ion implantation is carried out on the front face of a floating zone silicon wafer first, then a high-temperature resistant metal is used as a medium to bond the back-off floating zone silicon wafer, and a heavily CZ-doped silicon wafer forms the semiconductor substrate. After bonding, the floating zone silicon wafer is used to prepare an insulated gate bipolar transistor (IGBT), and the heavily CZ-doped silicon wafer is used as the low-resistance back contact, so the required amount of the floating zone silicon wafers used is reduced, and production cost is lowered. Meanwhile, the back metallization process is not required after bonding, so the processing procedures are simplified, and the production yield is enhanced.

8 Claims, 5 Drawing Sheets

METHOD FOR MANUFACTURING SEMICONDUCTOR SUBSTRATE OF LARGE-POWER DEVICE

TECHNICAL FIELD

The present invention belongs to the technical field of high-voltage, large-power devices and relates to a method for manufacturing a semiconductor substrate, in particular to a method for manufacturing the semiconductor substrate of a large-power device.

BACKGROUND TECHNOLOGY

A power semiconductor is the internal driving force of the continuously developing power-electronic system and has irreplaceable effects, especially in the aspects of energy conservation, dynamic control, noise reduction, etc. The power semiconductor is mainly used for control over the energy transfer between an energy source and a load and has the characteristics of high precision, high speed and low power consumption. In the past 20 years, power device and the encapsulation technology have developed fast, in particular for the power MOS transistors replacing traditional bipolar transistors in many application fields because of the excellent features of high input impedance, short cutoff time, etc. At present, power MOS transistors are mainly classed into the following types: u-shaped MOS transistors (UMOSFET), insulated gate bipolar transistors (IGBT), etc.

The IGBT is a combined, full-control, voltage-drive-type power semiconductor consisting of a bipolar junction transistor (BJT) and a MOS transistor. FIG. 1 shows the structure of an N-trench enhanced IGBT, wherein n-type source regions 104a and 104b are respectively formed in the p-type regions (sub-trench regions) 103a and 103b, a gate stack region 110 is comprised of a gate dielectric layer 105 and a gate electrode 106, the gate dielectric layer 105 may be silicon dioxide, and the gate electrode 106 may be doped polycrystalline. The working trench region of the device is formed on the surface of the substrate close to the gate stack region 110. An n-type drift region 102 is formed above an n-type drain region 101; a P+ region 100 on the other side of the drain region 101 is a drain injection region which is an exclusive functional region of the IGBT, which together with the drain region and the sub-trench region forms a PNP bipolar transistor to function as an emitter, injecting hollow cavities into the drain region and performing conducive modulation to reduce the conductive voltage of the device. The switching function of the IGBT refers to an applied positive gate voltage to form trenches and provide a base current to the PNP transistor so as to turn the IGBT on, or on the contrary, apply a negative gate electrode to remove the trenches and cut off the base current so as to turn the IGBT off. The IGBT has the combined advantages of high input impedance of the MOSFET and low conductive voltage drop of the gate turn-off transistor (GTR) and is therefore very suitable for application in DC systems with a DC voltage of 600V or above, such as DC motors, frequency converters, switching power supplies, illumination circuits, traction drives, etc.

At present, mainstream IGBT need high-priced floating zone silicon as the substrate. Furthermore, if the IGBT is manufactured by the prior art, back ion implantation and low-temperature annealing processes which are susceptible to damaging the front metal are required; meanwhile, the back surface needs thinning, which is complicated and easily damages the silicon wafer.

DISCLOSURE OF THE PRESENT INVENTION

The present invention aims to provide a novel method for manufacturing a semiconductor substrate of an IBGT to avoid using the back ion implantation, low-temperature annealing and back thinning processes when manufacturing the IGBT, so as to simplify the processing procedures of the IGBT and increase production yield.

The method for manufacturing the semiconductor substrate of the large-power device adopts the processing procedures of bonding the floating zone silicon wafer and a heavily CZ-doped silicon wafer, comprising:

Step 1: process the required floating zone silicon wafer, which comprises the procedures of:

Providing a silicon substrate;

Performing hydrogen ion (H+) injection and annealing on the silicon substrate to form a heavily H-doped layer in the silicon wafer;

Performing phosphorous or boron ion injection to form a first doping type of the buffer layer between the heavily H-doped layer and the silicon wafer surface;

If the first doping type uses phosphorous ions, performing boron ion injection to form a second doping type of a heavily doped region on the silicon wafer surface and on the upper part of the first doping type of the buffer layer, wherein the depth is smaller than that of the first doping type of the buffer layer; if the first doping type uses boron ions, performing the phosphorous ion injection to form a second doping type of a heavily doped region on the silicon wafer surface and on the upper part of the first doping type of the buffer layer, wherein the depth is smaller than that of the first doping type of the buffer layer;

Forming a first insulation film on the silicon wafer surface,

Forming a first photoresist layer on the first insulation film;

Performing masking, exposing and etching and keeping a circle of first insulation film on the edge of the silicon wafer;

Removing the first photoresist layer;

Forming a first diffusion-impervious layer on the silicon wafer surface and on the first insulation film;

Step 2: process the required heavily CZ-doped silicon wafer, which comprises the procedures of:

Providing a heavily CZ-doped silicon substrate which has the same doping type as the first doping type in the first step;

Forming a diffusion-impervious layer on the surface of the CZ silicon substrate;

Forming a metal or metal oxide layer on the surface of the diffusion-impervious layer formed in the previous step;

Forming a first photoresist layer on the metal or metal oxide layer formed in the previous step;

Optically etching the first photoresist layer formed in the previous step and the etching to remove a circle of diffusion-impervious layer and a circle of metal or metal oxide on the edge of the CZ silicon wafer;

Removing the first photoresist layer;

Step 3: bond the diffusion-impervious layer of the floating zone silicon wafer formed in the first step with the metal or metal oxide on the heavily CZ-doped silicon wafer formed in the second step and then remove the floating zone silicon wafer part of the H-layer or above the H-layer in the floating zone silicon wafer.

Furthermore, the first doping type may be p-type doping or n-type doping. The diffusion-impervious layer may be a TaN, TiN, or Ta/TaN combined layer or a Ti/TiN combined layer with a thickness of 10-50 nm. The metal or metal oxide is a high-temperature-resistant metal material such as W, Ti, Ta, TiN, TaN, etc.

It should be noted that the metal island structure in the heavily CZ-doped silicon wafer shall be matched with the trench structure formed in the floating zone silicon wafer so as to ensure seamless bonding of the two types of silicon wafers.

The method for forming the semiconductor substrate by bonding the floating zone silicon wafer and the heavily CZ-doped silicon wafer has the following advantages:

1. The floating zone silicon wafer is bonded with the heavily CZ-doped silicon wafer, the floating zone silicon wafer after being bonded is used to prepare the IGBT, the heavily CZ-doped silicon wafer is used as the low-resistance back contact, so the amount of the floating zone silicon is reduced and one floating zone silicon wafer is capable of forming a plurality of bonded compound silicon wafers, resulting in a lowered production cost.

1. The front face of the floating zone silicon wafer before bonding is changed into the back electrode of the IGBT after bonding; so, if the ion implantation is carried out on the front face of the floating zone silicon wafer before bonding, the back ion implantation and low-temperature annealing processes are not required after bonding, which simplifies the processing procedures.

3. The high-temperature metal is used as the medium between two silicon wafers when bonding, so the back metallization process is capable of being removed, and the production yield is improved.

BRIEF DESCRIPTION OF THE ATTACHED DRAWINGS

Figures from 3a to 3c show a process flowchart of an embodiment provided by the invention for preparing the heavily CZ-doped silicon wafer.

Figure 4A:
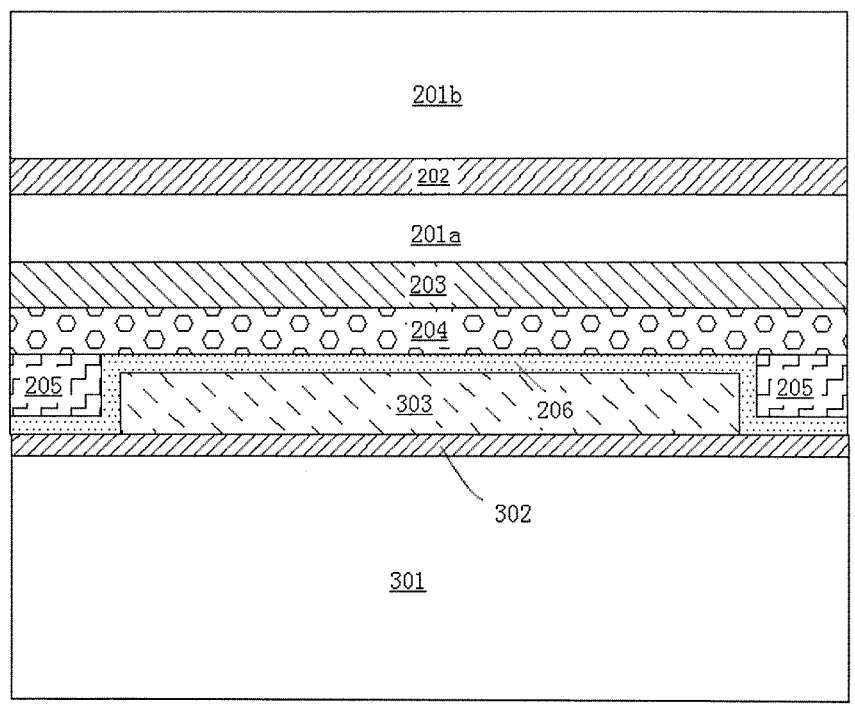
Figure 4B:
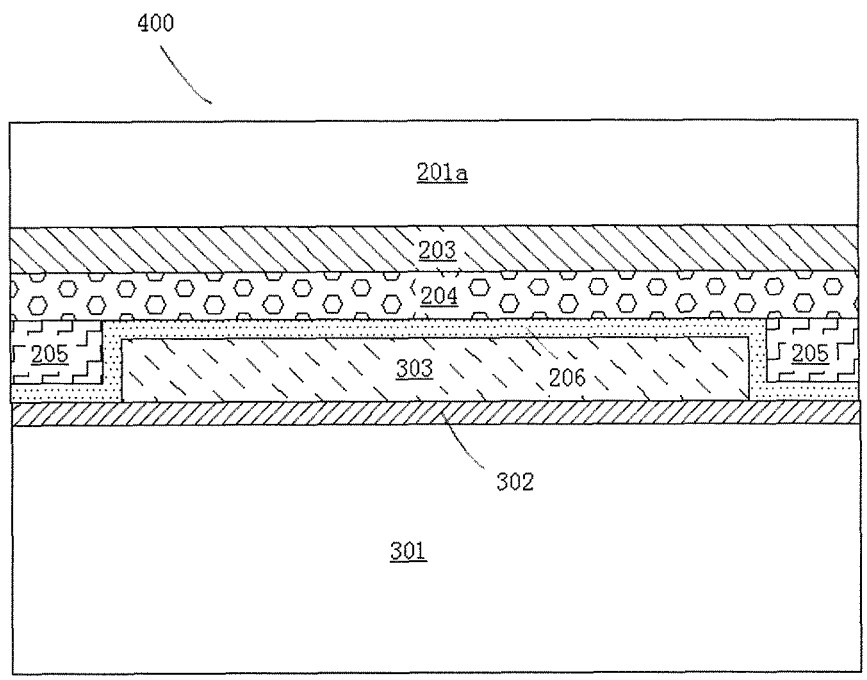

FIGS. 4a and 4b show a process flowchart provided by the invention for bonding the floating zone silicon wafer with the heavily CZ-doped silicon wafer.

Figure 5A:
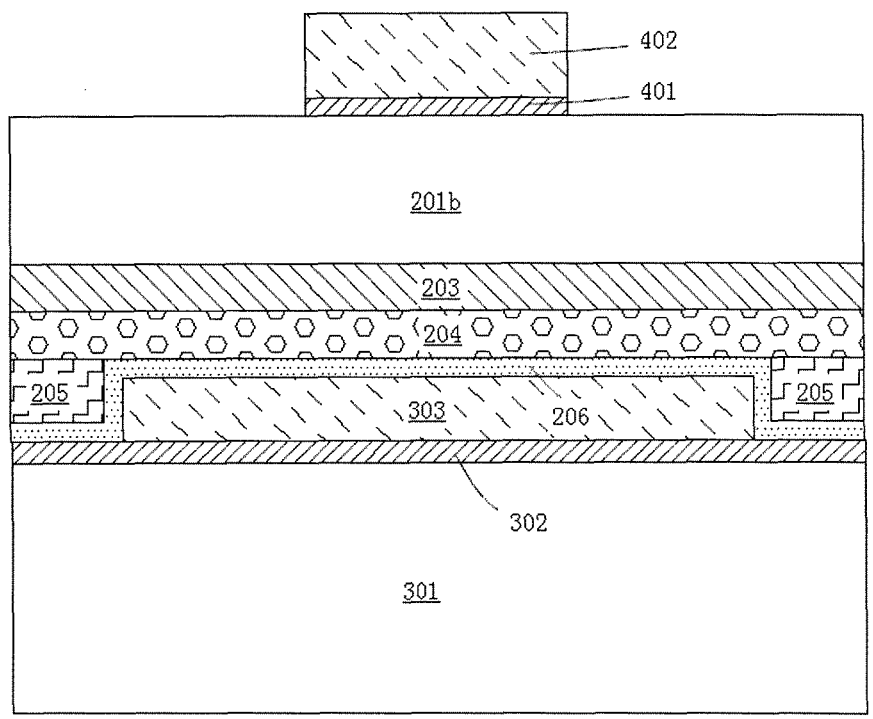
Figure 5B:
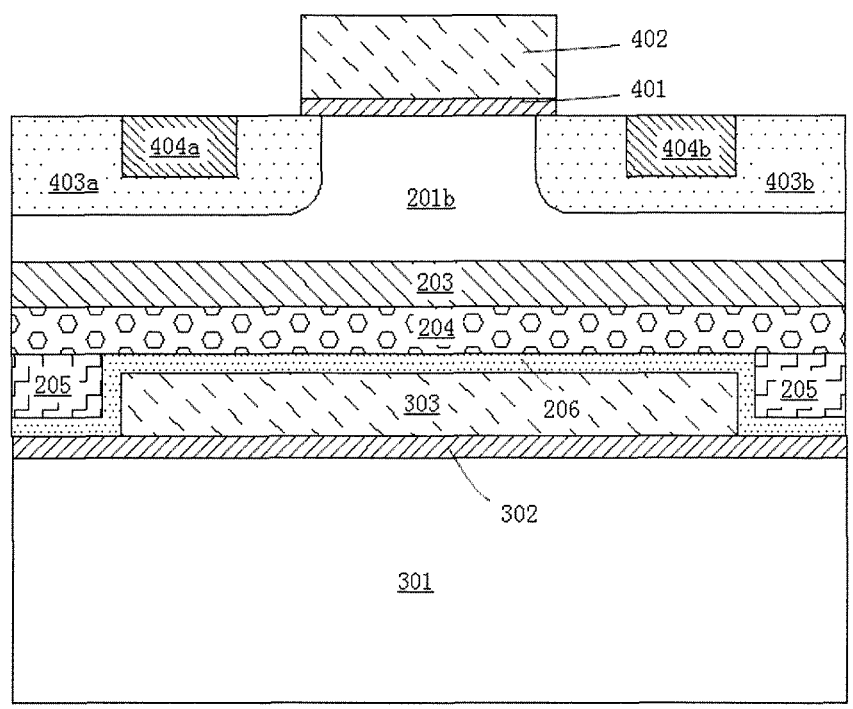

FIGS. 5a and 5b show a process flowchart for preparing the IGBT by adopting the semiconductor provided by the invention.

OPTIMAL EMBODIMENT OF THE INVENTION

The embodiment of the invention is described in detail with reference to the attached drawings. To facilitate the description, the thicknesses of the layers and regions in the figures are amplified and shall not represent the real sizes. Although the drawings fail to completely reflect the accurate real dimensions of the device, they still completely show the relative positions of the regions and the components, especially the vertical and neighbor relations of the components.

The reference is a schematic view of an ideal embodiment. The embodiment of the present invention shall not be limited to the specific shapes of the regions as shown in the figure but instead comprise obtained shapes, including deviations caused by manufacturing. Meanwhile, in the below descriptions, the terms "silicon wafer" and "substrate" may be understood as semiconductor wafers being processed or may comprise other film layers therein.

Figure 1:
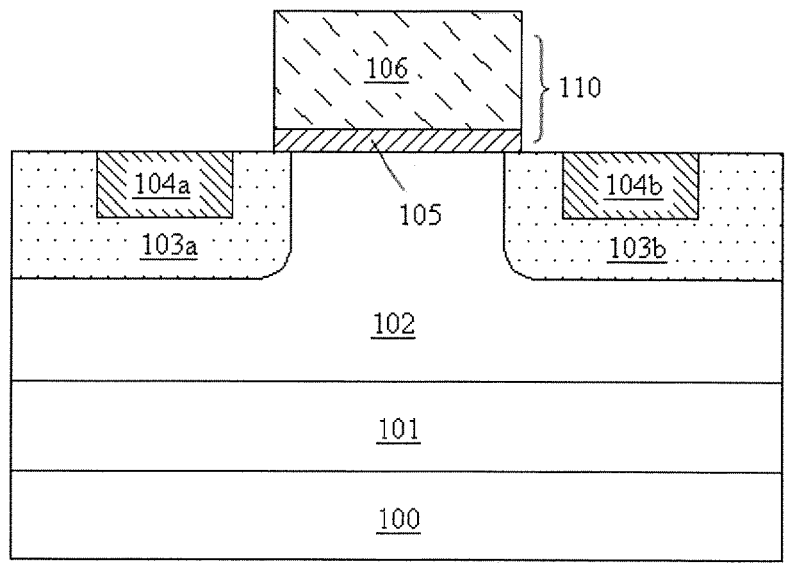
FIG. 1 is a sectional view of an N-type enhanced IGBT in the prior art.
Figure 2A:
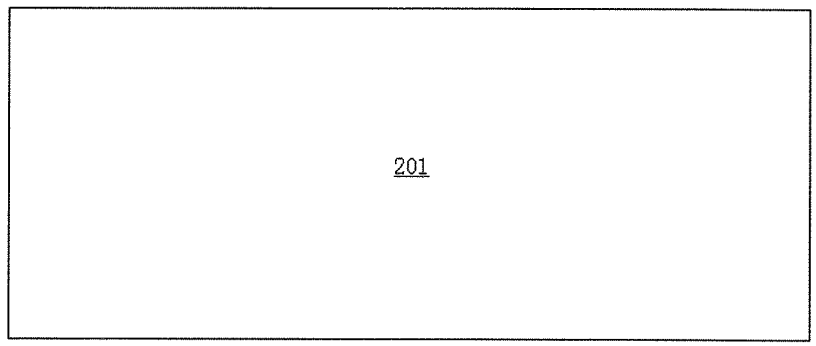
FIGS. 2a to 2d show a process flowchart of an embodiment provided by the invention for preparing the floating zone silicon wafer.
Figure 2B:
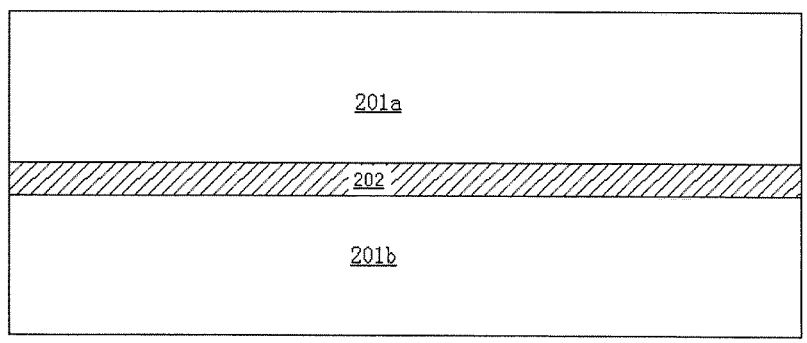

Preparation of the Floating Zone Silicon Wafer:

First, provide a lightly-doped n-type floating zone silicon substrate 201, as shown in FIG. 2a. Second, perform hydrogen ion (H+) injection to form an H-layer 202 in the floating zone silicon substrate 201, wherein the H-layer 202 divides the floating zone silicon substrate 201 into upper and lower parts 201a and 201b, as shown FIG. 2b.

Figure 2C:
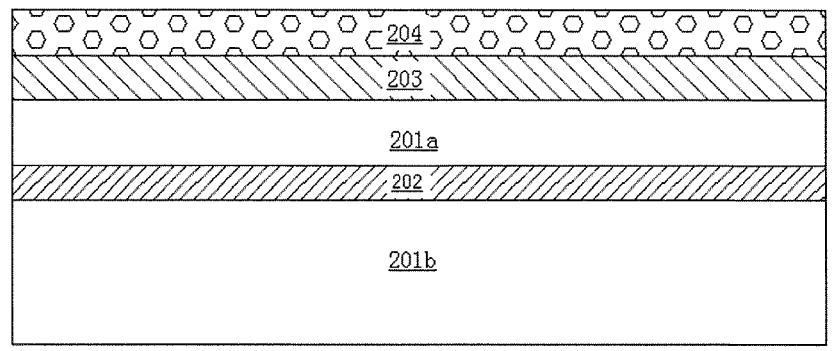

Third, perform n-type ion injection to form an n-type buffer layer 203 and then perform p-type ion injection to form a p-type doped region 204, as shown in FIG. 2c.

Figure 2D:
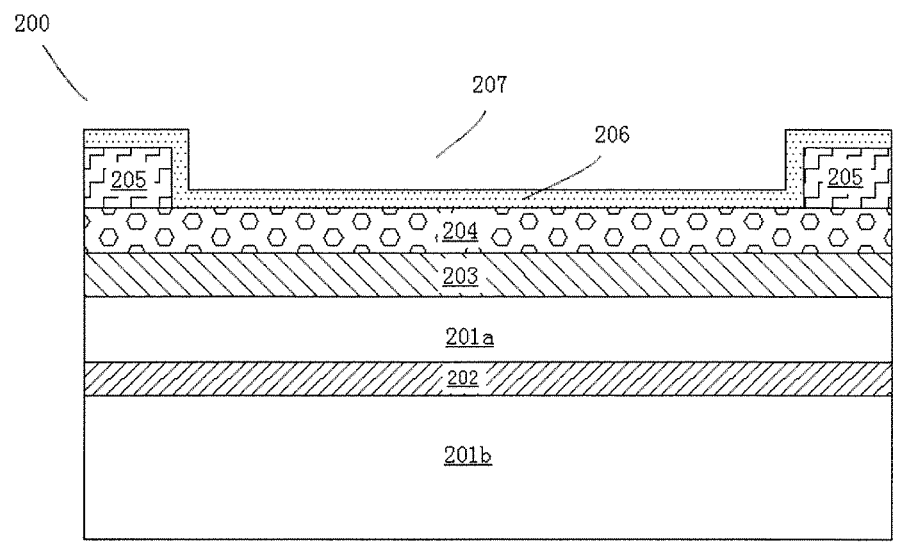

Fourth, deposit an insulation medium layer 205, e.g. silicon nitride, on the floating zone substrate 201, etch the silicon nitride layer 205 to form an opening and then deposit a diffusion-impervious layer 206, which may be a TaN, TaN or Ti/TaN compound layer or Ti/TiN compound layer. The silicon nitride layer 205 is etched to form the opening, so a trench 207 is formed on the floating region silicon substrate 201 after depositing the diffusion-impervious layer 206, as shown in FIG. 2d. Therefore, the floating zone silicon wafer structure 200 required for manufacturing the semiconductor substrate in the invention is formed.

Figure 3A:
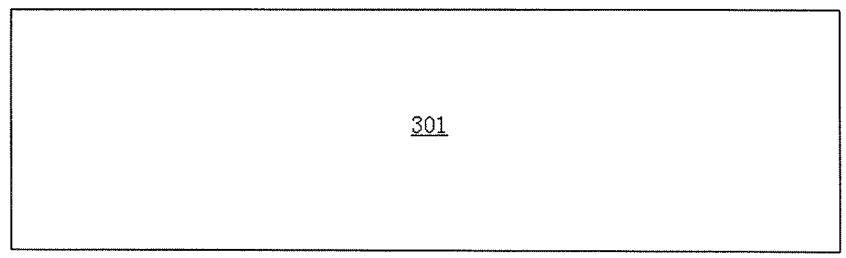
Figure 3B:
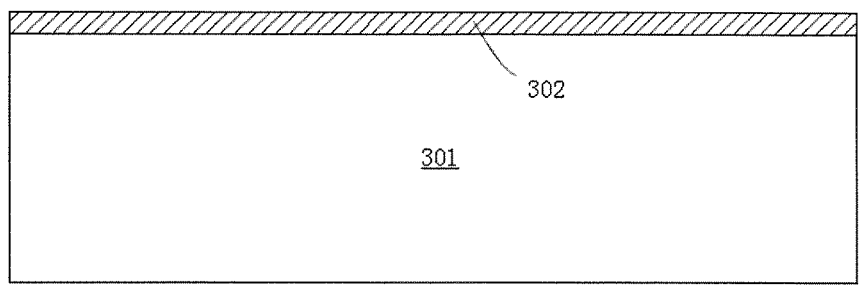

Preparation of the Low-Resistance Silicon Wafer:

First, provide a heavily doped p-type CZ silicon substrate 301, as shown in FIG. 3a. Second, deposit on the silicon substrate 301 to form a diffusion-impervious layer 302 as shown in FIG. 3b, wherein the diffusion-impervious layer 302 as shown in FIG. 3b may be a TaN, TaN or Ti/TaN compound layer or a Ti/TiN compound layer.

Figure 3C:
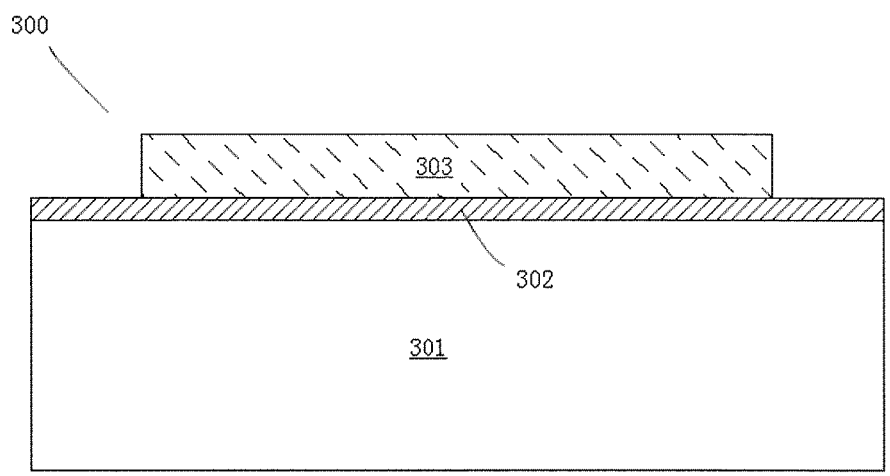

Third, deposit a high-temperature resistant metal layer on the diffusion-impervious layer 302, such as W, Ti, Ta, TaN or TaN, and then etch the formed metal layer to form a metal island 303 as shown in FIG. 3c. Therefore, the low-resistance silicon wafer structure 300 required for manufacturing the semiconductor substrate in the invention is formed.

It should be noted that the metal island 303 formed in the low-resistance silicon wafer 300 shall be matched with the trench structure 207 formed in the floating zone silicon wafer 200.

Preparation of the Semiconductor Substrate of the Large-Power Device

Back off the floating zone silicon wafer 200 and then bond the floating zone silicon wafer 200 with the low-resistance silicon wafer 300 to form a structure as shown in FIG. 4a, wherein the metal island 303 in the low-resistance silicon wafer 300 is just in the trench 207 of the floating zone silicon wafer 200.

Next, remove the substrate part 201b and the H-layer 202 in the floating zone silicon substrate 201 and then flatten the substrate with a CMP process, as shown FIG. 4b. Therefore, the semiconductor substructure structure 400 provided by the invention is formed.

The semiconductor substrate provided by the present invention is very suitable for manufacturing large-power devices such as IGBT, and the following description relates to the process flowchart for manufacturing the IGBT by adopting the semiconductor substrate provided by the invention.

First, oxidize the semiconductor substrate 400 as shown in FIG. 4b to form a silicon dioxide layer 401, then deposit a metal layer 402 and a photoresistor layer in turn; next, perform masking, exposing and etching to form the gate electrode structure of the IGBT and then remove the photoresistor as shown FIG. 5a, wherein the metal layer 402 is doped polycrystalline silicon.

Second, perform ion injection to form the p-type base regions 403a and 403b of the IGBT and then continuously form the source regions 404a and 404b of the IGBT in the p-type base regions 403a and 403b, as shown in FIG. 5b.

INDUSTRIAL APPLICATION

According to the method provided by the present invention, the floating zone silicon wafer and the heavily CZ-doped silicon wafer are directly bonded to form the semiconductor substrate, the floating zone silicon wafer after being bonded is used to prepare the IGBT, while the heavily CZ-doped silicon wafer is used as the low-resistance back contact, so, for the amount of required floating zone silicon, one piece of floating zone silicon wafer is capable of forming a plurality of bonded compound silicon wafers, and the production cost is lowered; the front face of the floating zone silicon wafer before bonding is changed into the back electrode of the IGBT after bonding, so if the ion injection is carried out on the front face of the floating zone silicon wafer before bonding, the back ion injection and low-temperature annealing processes are not required after bonding, which simplifies the processing procedure; high-temperature metal is used as the medium between two silicon wafers when bonding, so the back metallization process is capable of being removed, and the production yield is improved.

As mentioned above, under the condition of being within the spirit and scope of the present invention, there may be many embodiments with a variety of differences. It should be understood that, except where so claimed, the present invention is not limited to the embodiments described in the description.

The invention claimed is:

1. A method for manufacturing the semiconductor substrate of the large-power device adopts the processing procedures of bonding the floating zone silicon wafer and a heavily CZ-doped silicon wafer to form the semiconductor substrate, comprising:

Step 1: process the required floating zone silicon wafer, which comprises the procedures of:

Providing a silicon substrate;

Performing hydrogen ion (H+) injection and annealing on the silicon substrate to form a heavily H-doped layer in the silicon wafer;

Performing phosphorous or boron ion injection to form a first doping type of the buffer layer between the heavily H-doped layer and the silicon wafer surface;

If the first doping type uses phosphorous ions, performing boron ion injection to form a second doping type of a heavily doped region on the silicon wafer surface and on the upper part of the first doping type of the buffer layer, wherein the depth is smaller than that of the first doping type of the buffer layer; if the first doping type uses boron ions, performing the phosphorous ion injection to form a second doping type of a heavily doped region on the silicon wafer surface and on the upper part of the first doping type of the buffer layer, wherein the depth is smaller than that of the first doping type of the buffer layer;

Forming a first insulation film on the silicon wafer surface,

Forming a first photoresist layer on the first insulation film;

Performing masking, exposing and etching and keeping a circle of first insulation film on the edge of the silicon wafer;

Removing the first photoresist layer;

Forming a first diffusion-impervious layer on the silicon wafer surface and on the first insulation film;

Step 2: process the required heavily CZ-doped silicon wafer, which comprises the procedures of:

Providing a heavily CZ-doped silicon substrate which has the same doping type as the first doping type in the first step;

Forming a diffusion-impervious layer on the surface of the CZ silicon substrate;

Forming a metal or metal oxide layer on the surface of the diffusion-impervious layer formed in the previous step;

Forming a first photoresist layer on the metal or metal oxide layer formed in the previous step;

Optically etching the first photoresist layer formed in the previous step and the etching to remove a circle of diffusion-impervious layer and a circle of metal or metal oxide on the edge of the CZ silicon wafer;

Removing the first photoresist layer;

Step 3: bond the diffusion-impervious layer of the floating zone silicon wafer formed in the first step with the metal or metal oxide on the heavily CZ-doped silicon wafer formed in the second step and then remove the floating zone silicon wafer part of the H-layer or above the H-layer in the floating zone silicon wafer.

2. The method for manufacturing the semiconductor substrate of claim 1 wherein the first insulation film of step 1 is silicon dioxide or silicon nitride.

3. The method for manufacturing the semiconductor substrate of claim 1-2 wherein the diffusion-impervious layer of step 1 may be a TaN, TiN, or Ta/TaN combined layer or a Ti/TiN combined layer with a thickness of 10-50 nm.

4. The method for manufacturing the semiconductor substrate of claim 1-2 wherein the first doping type is p-type doping and the second doping type is n-type doping or the first doping type is n-type doping and the second doping type is p-type doping in step 1.

5. The method for manufacturing the semiconductor substrate of claim 1 wherein the first doping type may be p-type doping or n-type doping in step 2.

6. The method for manufacturing the semiconductor substrate of claim 1 wherein the diffusion-impervious layer of step 2 may be a TaN, TiN, or Ta/TaN combined layer or a Ti/TiN combined layer with a thickness of 10-50 nm.

7. The method for manufacturing the semiconductor substrate of claim 1 wherein the metal or metal oxide in step 2 is W, Ti, Ta, TiN, or TaN.

8. The method for manufacturing the semiconductor substrate of claim 1 wherein the metal island formed in the low-resistance silicon wafer shall be matched with the trench structure formed in the floating zone silicon wafer so as to ensure seamless bonding of the two types of silicon wafers.

* * * * *